United States Patent
Liu et al.

(10) Patent No.: US 10,453,774 B1
(45) Date of Patent: Oct. 22, 2019

(54) THERMALLY ENHANCED SUBSTRATE

(71) Applicant: QUALCOMM Incorporated, San Diego, CA (US)

(72) Inventors: Kai Liu, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/051,528

(22) Filed: Aug. 1, 2018

(51) Int. Cl.
| | |
|---|---|
| *H01L 23/373* | (2006.01) |
| *H01L 23/00* | (2006.01) |
| *H01L 27/01* | (2006.01) |
| *H01L 23/66* | (2006.01) |
| *H01L 23/522* | (2006.01) |

(52) U.S. Cl.
CPC ...... *H01L 23/3735* (2013.01); *H01L 23/3732* (2013.01); *H01L 23/5223* (2013.01); *H01L 23/5227* (2013.01); *H01L 23/66* (2013.01); *H01L 24/17* (2013.01); *H01L 27/01* (2013.01); *H01L 2223/6672* (2013.01)

(58) Field of Classification Search
CPC ............ H01L 23/3735; H01L 23/3732; H01L 23/5223; H01L 27/01; H01L 24/17; H01L 23/66; H01L 2223/6672
See application file for complete search history.

(56) References Cited

U.S. PATENT DOCUMENTS

2019/0157584 A1* 5/2019 Liu ................... H01L 51/0097

* cited by examiner

*Primary Examiner* — Dung A. Le
(74) *Attorney, Agent, or Firm* — Qualcomm Incorporated

(57) ABSTRACT

Aspects generally relate to an integrated circuit including a glass substrate. On a surface of the glass substrate a thermally conductive insulating layer is formed. At least one metal layer is formed above the thermally conductive insulating layer, and a plurality of thermal bumps extend through the at least one metal layer and couple to the thermally conductive insulating layer to dissipate heat from the substrate.

22 Claims, 4 Drawing Sheets

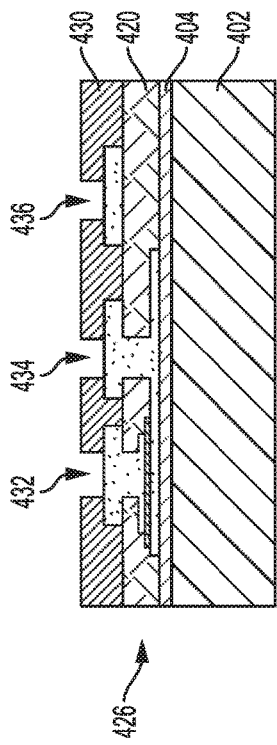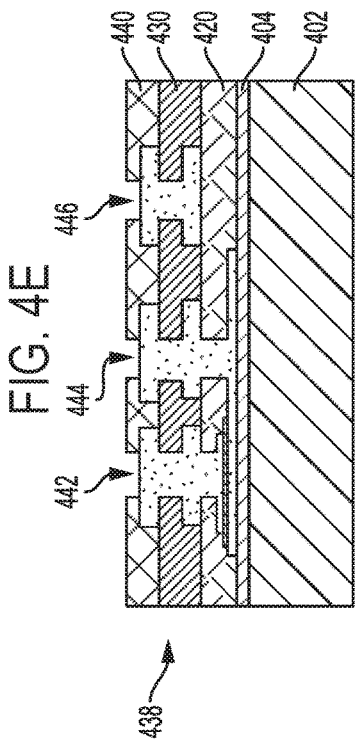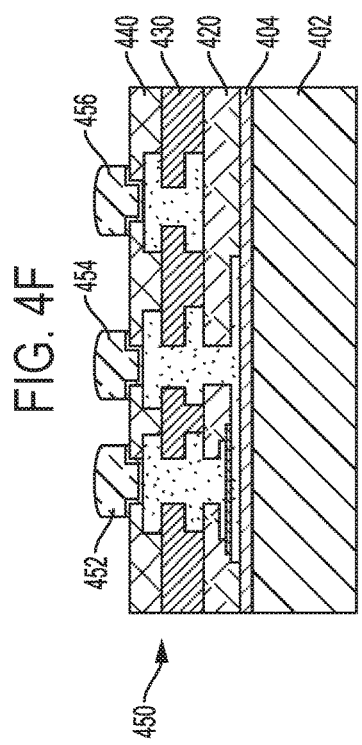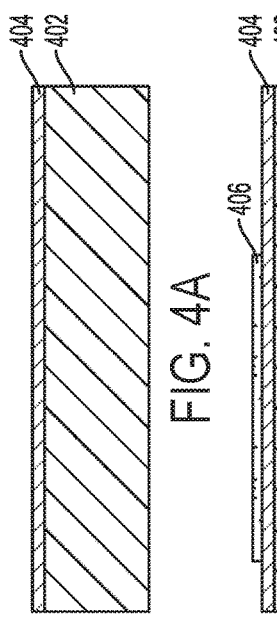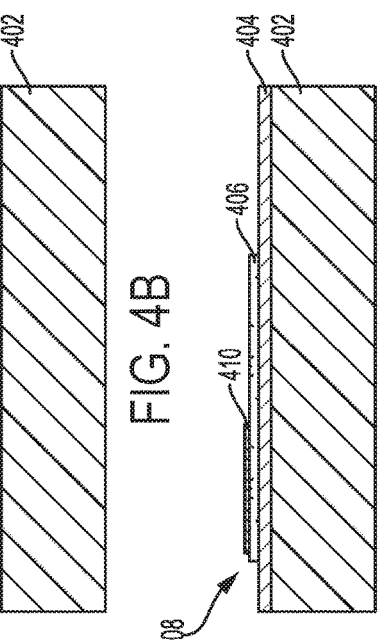

THERMALLY ENHANCED SUBSTRATE

BACKGROUND

I. Field of the Disclosure

Aspects of the disclosure relate generally to substrates in electronic devices, and in particular to thermally enhanced substrates.

II. Background

An integrated circuit (IC) is an electronic device that has many circuits that include active and passive components. In a typical IC the components are manufactured in and on a substrate material.

During operation, electronic devices generate heat. Heat generated during operation needs to be dissipated to prevent damage to the electronic device. Mechanisms used to dissipate heat in an electronic device should not interfere with the operation of the electronic device.

There is a need for mechanisms and methods to effectively dissipate heat from an electronic device without interfering with the operation of the device.

SUMMARY OF THE DISCLOSURE

The following presents a simplified summary of one or more aspects to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The described aspects generally relate to an integrated circuit including a glass substrate. On a surface of the glass substrate a thermally conductive insulating layer is formed. At least one metal layer is formed above the thermally conductive insulating layer, and a plurality of thermal bumps extend through the at least one metal layer and couple to the thermally conductive insulating layer.

In one embodiment, the thermally conductive insulating layer is a diamond layer. In another embodiment, the thermally conductive layer can be aluminum nitride, boron nitride, zinc oxide, or other material that provides electrical insulation and is a good thermal conductor. The thermally conductive insulating layer can be formed, for example, by chemical vapor disposition, or sputtering, or other technique.

In one embodiment the circuit can include an inductor formed in at least one metal layer. In another embodiment, the circuit can include inductors and capacitors formed in the metal layers to form a radio frequency (RF) filter, for example, an RF filter used for 5G.

The integrated circuit can also include a thermal enhancement ring formed on the thermally conductive insulating layer. At least one of the thermal bumps can be coupled to the thermal enhancement ring. The thermal enhancement ring can be, for example, made of copper, aluminum, or other thermal conductive material.

In another embodiment, a passive on glass (POG) device includes a glass substrate. On a surface of the glass substrate a thermally conductive insulating layer is formed. A radio frequency (RF) filter is formed in a plurality of metal layers formed on the thermally conductive insulating layer. A plurality of thermal bumps extend through the plurality of metal layers and couple to the thermally conductive insulating layer. At least one of the thermal bumps is coupled to a ground plane of a circuit.

The POG device can also include a thermal enhancement ring formed on the thermally conductive insulating layer, and at least one of the thermal bumps is coupled to the thermal enhancement ring. Also, the RF filter can be made to operate in a 5G network.

In another embodiment, aspects of making a thermally enhanced passive on glass (POG) device include forming a thermally conductive insulating layer on a surface of a glass substrate. Forming a plurally of metal layers above the thermally conductive insulating layer, with interlayer dielectric layers between the plurality of metal layers. Forming thermal bumps on a surface of the device, the thermal bumps extending through the interlayer dielectric layers and coupled to the thermally conductive insulating layer.

Aspects of the method of making a thermally enhanced passive on glass (POG) device include the thermally conductive insulating layer being diamond. Additional aspects include the thermally conductive insulating layer being aluminum nitride, boron nitride, zinc oxide, or other material that provides electrical insulation and is a good thermal conductor. Also, an aspect of making a thermally enhanced passive on glass (POG) device include forming a thermal enhancement ring on the thermally conductive insulation layer.

Various aspect and features of the disclosure are described in further detail below.

BRIEF DESCRIPTION OF THE FIGURES

The accompanying drawings are presented to aid in the description and illustrations of embodiments and are not intended to be limitations thereof.

FIGS. 4A-4G illustrate steps for forming a thermally enhanced POG device.

The drawings may not depict all components of a particular apparatus, structure, or method. Further, like reference numerals denote like features throughout the specification and figures.

DETAILED DESCRIPTION

Figure 1:
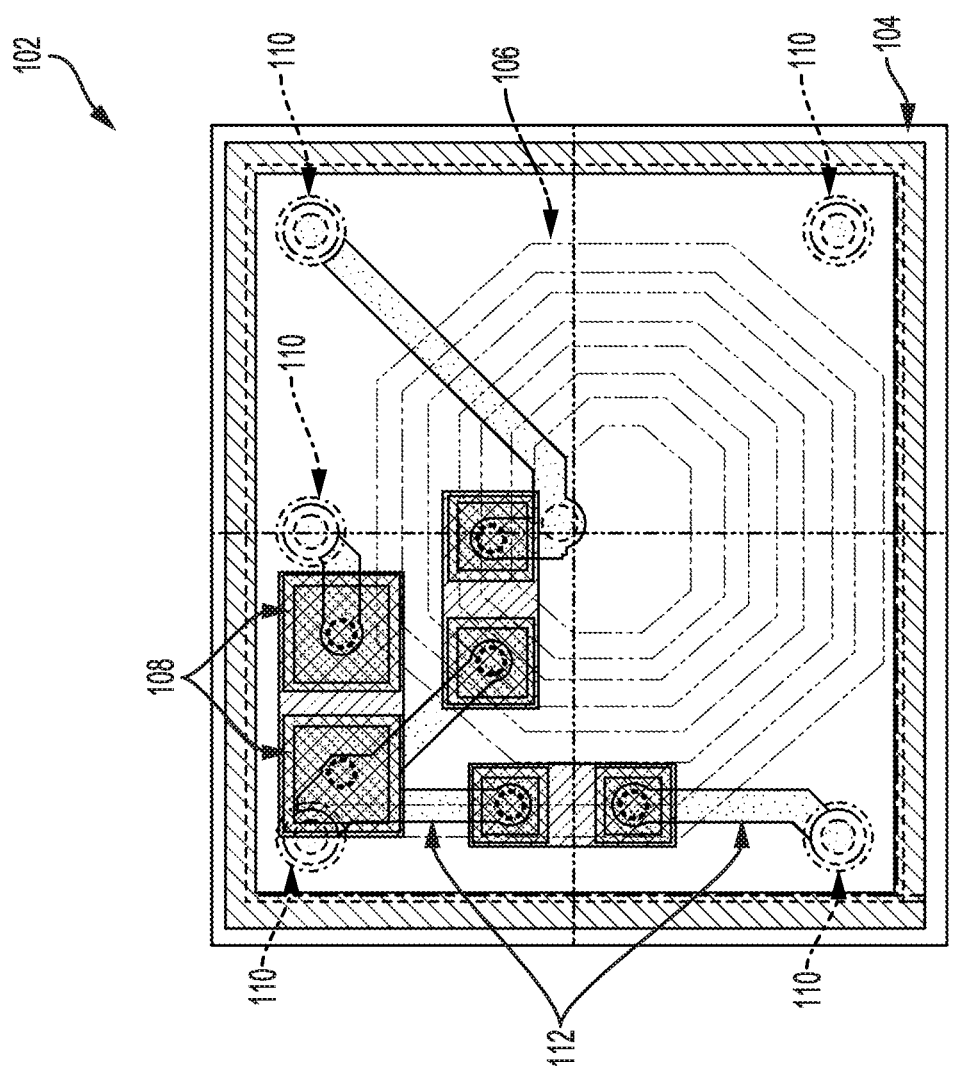
FIG. 1 is a diagram of an example passive on glass (POG) device.

Aspects disclosed in the following description and related drawings are directed to specific embodiments. Alternative embodiments may be devised without departing from the scope of the invention. Additionally, well-known elements may not be described in detail, or may be omitted, so as not to obscure relevant details. Embodiments disclosed may be suitably included in any electronic device.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting In a typical IC the components are manufactured in and on a substrate material. One type of substrate is a glass substrate. An example of an electronic device on a glass substrate includes passive devices on a glass substrate, referred to as passives on glass (POG). An example of a POG device include radio frequency (RF) devices, such as RF filters.

High-speed applications, such as 5G applications, need wide bandwidth filters. Typical wide bandwidth filters use inductor-capacitor (LC) filters. LC filters can provide wide bandwidth filters but can also generate heat that needs to be dissipated.

FIG. 1 is a diagram of an example passive on glass (POG) device. As shown in FIG. 1, the POG device 102 includes a glass substrate 104. Formed on the glass substrate 104 is an inductor 106. The example POG 102 illustrated in FIG. 1 also includes a capacitor 108, such as metal-insulator-metal (MIM) capacitor, used with the inductor 106 to form a filter circuit. The POG 102 also includes bump pads 110 and interconnection traces 112. The bump pads 110 and interconnection traces can be used to input and output signals and power and ground to the POG 102.

Figure 2:
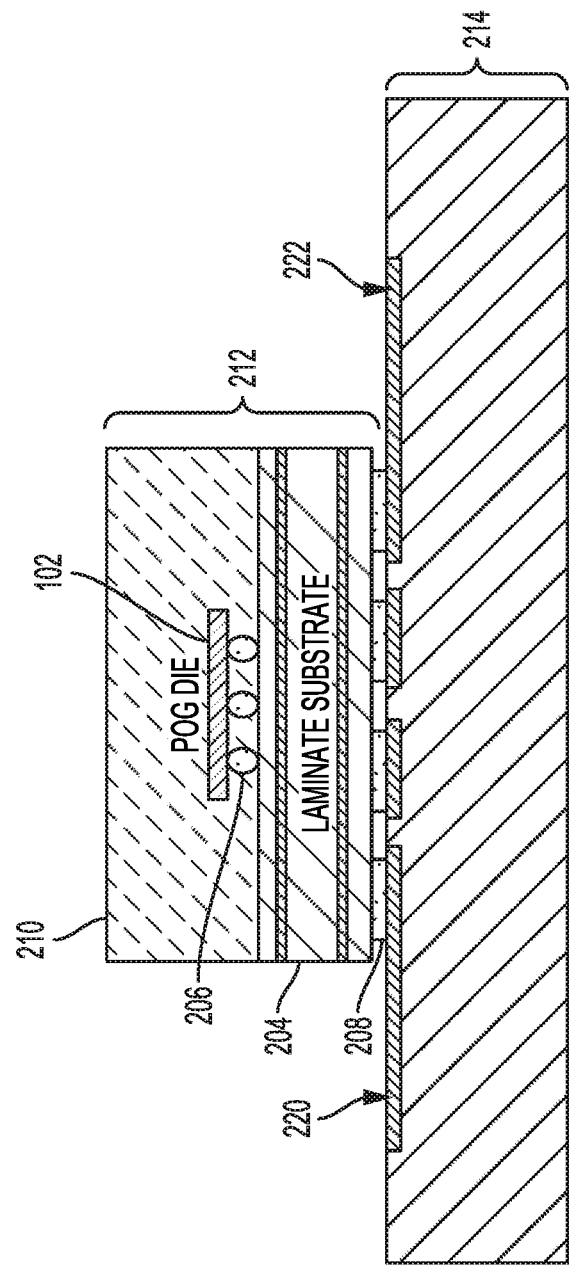
FIG. 2 is a cross section illustrating the POG mounted on a circuit board.

FIG. 2 is a cross section illustrating the POG mounted on a circuit board. The POG 102 is mounted on a substrate 204 with solder balls 206. The solder balls 206 provide electrical connection between the bum pads on the POG 102 and the substrate 204. The substrate can provide electrical connection between the solder balls 206 and contacts 208 on a side of the substrate opposite the POG 102. There can be an encapsulation 210 covering the POG forming a POG package 212 to provide protection for the POG device.

The POG package 212 can be coupled to a printed circuit board (PCB) 214. The PCB 214 include traces, such as an input trace 220 and an output trace 222. The PCB 214 also includes power and ground planes (not shown). The traces and power and ground plane are coupled to the POG 102 through the electrical interconnects 208, through the substrate 204, through the solder balls 206 to the bump pads on the POG 102. The connections to the ground planes, in addition to providing electrical connection to the ground planes, also provide thermal connection to dissipate heat.

Using glass as a substrate for a POG provides several advantages over other substrate materials, such as laminate and high resistance silicon (HRS) substrates. For example, a glass substrate is a good electrical insulator so that better quality inductors can be made on a glass substrate because there is no electrical loss due to eddy currents generated in the substrate. In addition, multiple metal layers can be built on a glass substrate to allow high-density inductors to be fabricated for analog and RF applications. A drawback to using a glass substrate is that it has low thermal conductivity. During operation components on a POG generate heat that needs to be dissipated to prevent damage to the device. Because of its low thermal conductivity, it is difficult to remove heat from the glass substrate.

To take advantage of the high electric isolation and address the low thermal conductivity of a glass substrate one aspect is to form a layer of material that has good electrical insulation and high thermal conductivity on the glass substrate. Examples of materials that are good electrical insulators and also have high thermal conductivity include diamond, aluminum nitride, boron nitride, and zinc oxide.

Figure 3:
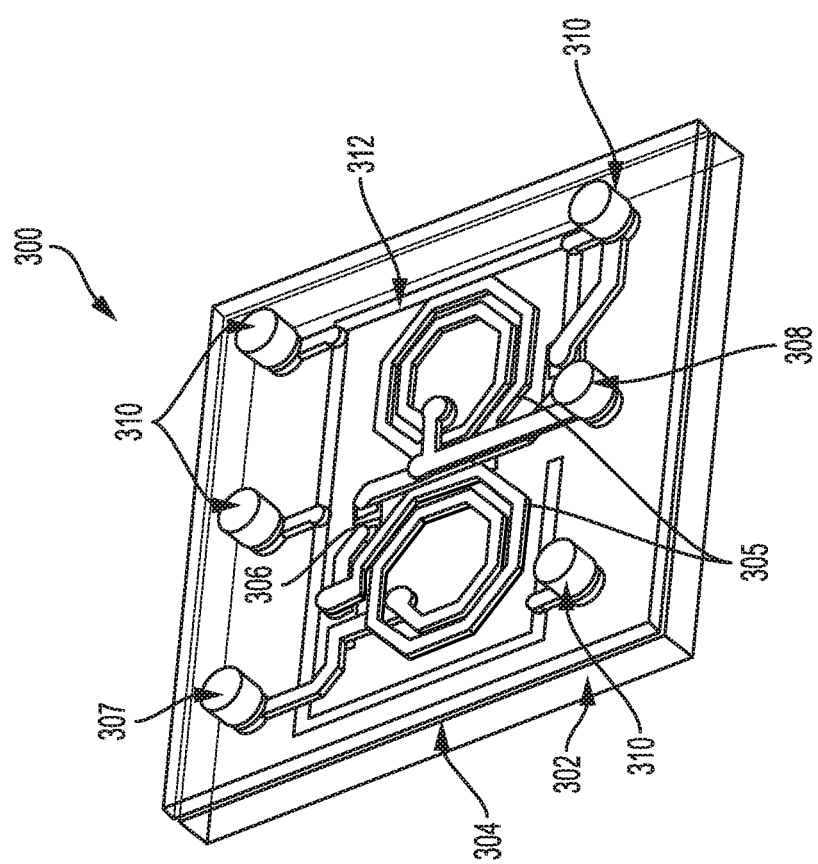
FIG. 3 is a 3D perspective of an example thermally enhanced passive on glass (POG) device.

FIG. 3 is a 3D perspective of an example thermally enhanced passive on glass (POG) device 300. The thermally enhanced POG device 300 includes a glass substrate 302. On a surface of the glass substrate 302 there is a thin diamond layer 304 that maintains electrical insulation while also providing high thermal conductivity. In the example of FIG. 3 the material used to provide high electrical isolation and high thermal conductivity is diamond, in other examples different materials can be used, such as, aluminum nitride, boron nitride, zinc oxide, or other thermal conductive dielectric material that provides good electrical insulation and high thermal conductivity.

Formed on top of the diamond layer are multiple metal layers with interlayer dielectric material formed between the multiple metal layers. The multiple metal layers are used to form passive devices, such as inductors 305 and capacitors 306. In the example of FIG. 3 there is an input terminal 307 and an output terminal 308. The input terminal 307 is coupled to an input section of the thermally enhanced POG and the output terminal 308 is coupled to an output section of the thermally enhanced POG. In one embodiment the thermally enhanced POG device 300 includes inductors 305 and capacitors 306 to form an RF filter and an RF input signal is coupled to the input terminal 307 and an output RF signal is output from the output terminal 308.

In FIG. 3, there are a plurality of thermal bumps 310 extending through the plurality of metal and dielectric layers and making thermal contact to the diamond layer 304. The thermal bumps 310 provide a thermal path for heat to dissipated from the thermally enhanced POG device. Thermally enhanced POG can also include a thermal enhancement ring 312 extending across a portion of the diamond layer 304. The thermal enhancement ring 312 can be a copper, aluminum, or other thermally conductive material. The thermal bumps 310 can be coupled to the thermal ring 312 to provide a thermal path to dissipate heat from the thermally enhanced POG device 306. In one embodiment, the thermally enhanced POG device 306 does not include the thermal enhancement ring 312 and has a plurality of thermal bumps 310 coupled to the diamond layer 304.

FIGS. 4A-4G illustrate steps for forming a thermally enhanced POG device. In FIGS. 4A-4G some of the steps of forming the thermally enhanced POG device that are well known are not included for clarity. For example, some steps such as applying photoresist and etching are not described in detail, but are well known.

FIG. 4A illustrates a glass substrate 402. On a surface of the glass substrate 402 a layer of material that is a thermally conductive dielectric 404 is formed. In one embodiment, the thermally conductive dielectric material 404 is diamond. In other embodiments, the thermally conductive dielectric material 404 can be aluminum nitride, boron nitride, or zinc oxide. The thermally conductive dielectric material 404 can be formed using various techniques, for example, chemical vapor deposition (CVP), sputtering, and the like.

FIG. 4B illustrates forming a first metal layer 406 on the thermally conductive dielectric material 404. For example, the metal layer can form a thermal enhancement ring, plates of a metal-insulator-metal (MIM) capacitor, windings of an inductor, and the like.

FIG. 4C illustrates an example where a portion of the first metal layer 406 is going to be a first plate of a MIM capacitor 408. As illustrated in FIG. 4C a dielectric insulator 410 of the MIM capacitor 408 is formed.

FIG. 4D illustrates a second plate 412 of the MIM capacitor 408 formed on a top surface of the dielectric insulator 410. A first interlayer dielectric layer 420 is formed over a top surface of the thermally conductive dielectric layer 404, the first metal layer 406 and second plate 412 of the MIM capacitor 408. A first via 422 and a second via 424 are formed in the first interlayer dielectric layer 420.

FIG. 4E illustrates a second metal layer 426 formed on a top surface of the first interlayer dielectric layer 420. Traces in the second metal layer 420 can be used to form passive components, for example, inductors, or capacitors. Metal also forms in the first via 422 and second via 424 providing electric coupling between portions of the first metal layer 406 with portions of the second metal layer 426. A second interlayer dielectric 430 is formed over a top surface of the first dielectric layer 420 and the second metal layer 426. A third via 432, a fourth via 434, and a fifth via 436 are formed in the second interlayer dielectric layer 430.

FIG. 4F illustrates a third metal layer 438 formed on a top surface of the second interlayer dielectric layer 430. Metal also forms in the third via 432, fourth via 434, and fifth via 436 providing electric coupling between portions of the second metal layer 426 with portions of the third metal layer 438. A third interlayer dielectric 440 is formed over a top surface of the second dielectric layer 430 and the third metal layer 438. A sixth via 442, a seventh via 444, and an eighth via 446 are formed in the third interlayer dielectric layer 440.

FIG. 4G illustrates an under-bump metal layer 450 on inner surfaces of the sixth via 442, seventh via 44, and eight via 446 in the third dielectric layer 440. In one embodiment, the under-bump metal layer 450 is formed with a highly conductive material, such as silicide. In, and on top, of the sixth via 442 a first solder bump 452 is formed. In, and on top, of the seventh via 444 a second solder bump 454 is formed. In, and on top, of the eighth via 442 a third solder bump 456 is formed.

In the example of FIG. 4G, the first solder bump 452 can be used to couple to the second plate 412 of the MIM capacitor 408. The second solder bump 454 can function as a thermal bump 310 and couple to a thermal enhancement ring 312. The second solder bump 454 is also coupled to the first plate of the MIM capacitor 408. In addition, the second solder bump 454 can be coupled to the thermal conductive dielectric layer 404 in parallel with the coupling to the thermal enhancement ring 312. In other embodiments, solder bumps through vias can be coupled to the thermally conductive dielectric layer 404 directly. The third solder bump 456 is coupled to the second and third metal layers 426 and 438 respectively. For example, the third solder bump could be coupled to a passive component in the POG device.

While the example POG illustrated in FIGS. 4A-4G show three solder bumps, in a typical POG device there would be many more solder bumps. As described, the solder bumps can function as input and output terminals of the POG device, and other solder bumps can function as thermal bumps to dissipate heat from the POG device.

The various illustrative logical blocks, modules, and circuits described in connection with the aspects disclosed herein may be implemented or performed in an integrated circuit (IC), a system on a chip (SoC), an Application Specific Integrated Circuit (ASIC), a Field Programmable Gate Array (FPGA) or other programmable logic device, discrete gate or transistor logic, discrete hardware components, or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit comprising:
   a glass substrate;
   a thermally conductive insulating layer formed on a surface of the glass substrate;
   at least one metal layer formed above the thermally conductive insulating layer; and
   a plurality of thermal bumps extending through the at least one metal layer and coupled to the thermally conductive insulating layer.

2. The integrated circuit of claim 1, wherein the thermally conductive insulating layer comprises a diamond layer.

3. The integrated circuit of claim 2, wherein forming the diamond layer comprises a chemical vapor disposition.

4. The integrated circuit of claim 1, wherein the thermally conductive insulating layer comprises aluminum nitride.

5. The integrated circuit of claim 1, wherein the thermally conductive insulating layer comprises boron nitride.

6. The integrated circuit of claim 1, wherein the thermally conductive insulating layer comprises zinc oxide.

7. The integrated circuit of claim 1, further comprising an inductor formed in the at least one metal layer.

8. The integrated circuit of claim 1, further comprising inductors and capacitors formed in the at least one metal layer, wherein the inductors and capacitors form a radio frequency (RF) filter.

9. The integrated circuit of claim 8, wherein the RF filter is used in a 5G device.

10. The integrated circuit of claim 1, further comprising a thermal enhancement ring formed on the thermally conductive insulating layer.

11. The integrated circuit of claim 10, wherein the thermal enhancement ring is copper.

12. The integrated circuit of claim 10, wherein at least one of the plurality of thermal bumps is coupled to the thermal enhancement ring.

13. A passive on glass device, comprising:
    a glass substrate;
    a thermally conductive insulating layer formed on a surface of the glass substrate;
    a radio frequency (RF) filter formed in a plurality of metal layers formed on the thermally conductive insulating layer;
    a plurality of thermal bumps extending through the plurality of metal layers and coupled to the thermally conductive insulating layer;
    a circuit board with a ground plane, wherein at least one of the plurality of thermal bumps is coupled to the ground plane.

14. The device of claim 13, further comprising a thermal enhancement ring formed on the thermally conductive insulating layer.

15. The device of claim 14, wherein at least one of the plurality of thermal bumps is coupled to the thermal enhancement ring.

16. The device of claim 13, wherein the RF filter is used for a 5G signal.

17. A method of making a thermally enhanced passive on glass device, comprising:
- forming a thermally conductive insulating layer on a surface of a glass substrate;
- forming a plurally of metal layers above the thermally conductive insulating layer;
- forming interlayer dielectric layers between the plurality of metal layers;
- forming a plurality of vias between the plurality of metal layers and extending through the interlayer dielectric layers; and
- forming thermal bumps on a surface of the device, the thermal bumps coupled to vias extending through the interlayer dielectric layers and coupled to the thermally conductive insulating layer.

18. The method of claim 17, wherein the thermally conductive insulating layer is diamond.

19. The method of claim 17, wherein the thermally conductive insulating layer comprises diamond.

20. The method of claim 17, wherein the thermally conductive insulating layer comprises aluminum nitride.

21. The method of claim 17, wherein the thermally conductive insulating layer comprises boron nitride.

22. The method of claim 17, further comprising forming a thermal enhancement ring on the thermally conductive insulating layer.

* * * * *